(12) United States Patent
Tsuyuki

(10) Patent No.: US 6,404,026 B2
(45) Date of Patent: Jun. 11, 2002

(54) SEMICONDUCTOR DEVICES

(75) Inventor: Masahiko Tsuyuki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/749,020

(22) Filed: Dec. 27, 2000

(30) Foreign Application Priority Data

Dec. 27, 1999 (JP) .......................................... 11-371190
Dec. 8, 2000 (JP) ....................................... 2000-374379

(51) Int. Cl.[7] .......................... H01L 29/76; H01L 29/94
(52) U.S. Cl. ...................... 257/409; 257/127; 257/483; 257/484; 257/750; 257/758
(58) Field of Search ................................ 257/409, 127, 257/750, 758, 483, 484, 487, 553; 438/140, 454

(56) References Cited

U.S. PATENT DOCUMENTS

| | | | |
|---|---|---|---|
| 4,642,880 A | * 2/1987 | Mizutani et al. | 29/571 |
| 4,814,288 A | * 3/1989 | Kimura et al. | 437/454 |
| 5,872,383 A | * 2/1999 | Yagishita | 257/407 |
| 5,898,206 A | * 4/1999 | Yamamoto | 257/360 |

FOREIGN PATENT DOCUMENTS

JP  10-163334  * 6/1998 ....... H01L/21/8234
JP  11-54641   * 2/1999 ....... H01L/21/8249

* cited by examiner

*Primary Examiner*—Jasmine J. B. Clark
(74) *Attorney, Agent, or Firm*—Konrad, Raynes, Victor & Mann, LLP; Alan S. Raynes

(57) ABSTRACT

A semiconductor device 100 has a substrate 11 including a high breakdown voltage transistor region where transistors with high breakdown voltage and high dielectric strength Qn and Qp are formed and a low breakdown voltage transistor region where transistors with low breakdown voltage and low dielectric strength are formed. The transistors with high voltage breakdown and high dielectric strength Qn and Qp and the transistors with low voltage breakdown and low dielectric strength operate at different voltages. In the high breakdown voltage transistor region, the semiconductor device has metal wiring layers 19a and 19b that are fed with a high potential. The metal wiring layers 19a and 19b are provided over the transistors with high voltage breakdown and high dielectric strength Qn and Qp through a first interlayer dielectric film 16 and a second interlayer dielectric film 17. An element isolation dielectric region 14 is provided over the substrate 11. Fixed potential wiring layers 18a and 18b are provided in the high voltage breakdown transistor region between the element isolation dielectric region 14 and the metal wiring layers 19a and 19b. The fixed potential wiring layers 18a and 18b are connected by contact sections 42a and 42b to contact regions 40a and 40b, respectively, that are composed of impurity diffusion layers formed in the semiconductor substrate 1.

24 Claims, 7 Drawing Sheets

SEMICONDUCTOR DEVICES

Japanese patent application no. 11-371190, filed Dec. 27, 1999, is hereby incorporated by reference in its entirety. Japanese patent application no. 2000-374379, filed Dec. 8, 2000, is hereby incorporated by reference in its entirety.

FIELD OF THE INVENTION

Embodiments of the present invention relates to monolithic integrated circuits, including semiconductor devices having transistors with low breakdown voltage and transistors with high breakdown voltage that form a very miniaturized integrated circuit.

RELATED ART

LSI chips are diversified, and higher device integration, further size reduction and lower power consumption are required for the diversified LSI chips. One type of integrated circuit mix-mounts a logic section that is composed of transistors with low breakdown voltage and an input/output circuit that is composed of transistors with high breakdown voltage.

In a region where transistors with high breakdown voltage are disposed (hereafter referred to as "high breakdown voltage transistor region"), an element isolation dielectric region generally needs to have a film thickness greater than a film thickness of an element isolation dielectric region in a region where transistors with low breakdown voltage are disposed (hereafter referred to as "low breakdown voltage transistor region") in order to attain a higher breakdown voltage. For example, when a power supply voltage is 20 V, an element isolation dielectric region in a high breakdown voltage transistor region needs to have a film thickness of about 900 nm. When a power supply voltage is 40 V, an element isolation dielectric region in a high breakdown voltage transistor region needs to have a film thickness of about 1400 nm.

When an element isolation dielectric region in a high voltage breakdown or high dielectric strength transistor region does not have a sufficient film thickness, an impurity concentration of an inversion prevention layer (i.e., a channel stopper layer) that prevents an operation of a parasitic MOS transistor may be made higher. Such a measure may deal with the insufficiency in the film thickness. However, the impurity concentration of such an inversion prevention layer is restricted to a specified range, and therefore the range of potentials that can be dealt with by the adjustment of impurity concentration is limited.

In a low breakdown voltage transistor region, where transistors with low breakdown voltage are manufactured under a 0.8 $\mu$m rule or lower, the thickness of an element isolation dielectric film by LOCOS (Local Oxidation of Silicon) is restricted to a specified range (for example, about 600 nm). Such a film thickness is required because of the miniaturized transistor elements. More specifically, as the transistor elements are miniaturized, an interlayer dielectric film is also made thinner in areas over a semiconductor substrate where transistors with low breakdown voltage and transistors with high breakdown voltage are formed. To reduce a step difference in the interlayer dielectric film at an element isolation dielectric region, the thickness of the element isolation dielectric region needs to be relatively small.

It is difficult to incorporate transistors with high breakdown voltage in a semiconductor device that is designed under a miniaturized design rule. In other words, when a thick element isolation dielectric film is formed to secure sufficient dielectric strength for transistors with high breakdown voltage, a step difference becomes substantially large at edge sections of the transistors. This makes it difficult to form transistors with low breakdown voltage and circuit wirings for the transistors in some areas over the substrate.

SUMMARY

One embodiment relates to a semiconductor device comprising a substrate including a first breakdown voltage transistor area having at least one transistor with a first breakdown voltage and a second breakdown voltage transistor area having at least one transistor with a second breakdown voltage, wherein the first breakdown voltage is greater than the second breakdown voltage. The device also includes an interlayer dielectric film provided over the substrate and a wiring layer provided over the interlayer dielectric film above the transistor with the first breakdown voltage. The device also includes an element isolation dielectric region on the substrate, and at least one fixed potential wiring region in the first breakdown voltage transistor area between the element isolation dielectric region and the wiring layer.

Another embodiment relates to a semiconductor device comprising a substrate including a first breakdown voltage transistor region including a first transistor and a second breakdown voltage transistor region including a second transistor having a breakdown voltage less than that of the first transistor, wherein the first and second transistors operate at different voltages. The device includes an element isolation dielectric region formed on the substrate to electrically isolate the first transistor from the second transistor, and a guardring region comprising an impurity diffusion region disposed in the semiconductor substrate in the first breakdown voltage transistor region. The device also includes a first interlayer dielectric film disposed over the substrate, and a second interlayer dielectric film disposed over the first interlayer dielectric film. The device also includes a wiring layer including a first wiring portion that is connected to the first transistor and a second wiring portion that is connected to the second transistor. The device also includes a fixed potential wiring region disposed in the first breakdown voltage transistor region between the element isolation dielectric film and the first wiring portion, wherein one of the wiring layer and the fixed potential wiring region is formed on the first interlayer dielectric film and the other of the wiring layer and the fixed potential wiring region is formed on the second interlayer dielectric film.

BRIEF DESCRIPTION OF THE DRAWINGS

Certain embodiments of the invention are described with reference to the accompanying drawings which, for illustrative purposes, are schematic and not necessarily drawn to scale.

DESCRIPTION OF PREFERRED EMBODIMENTS

Figure 1:
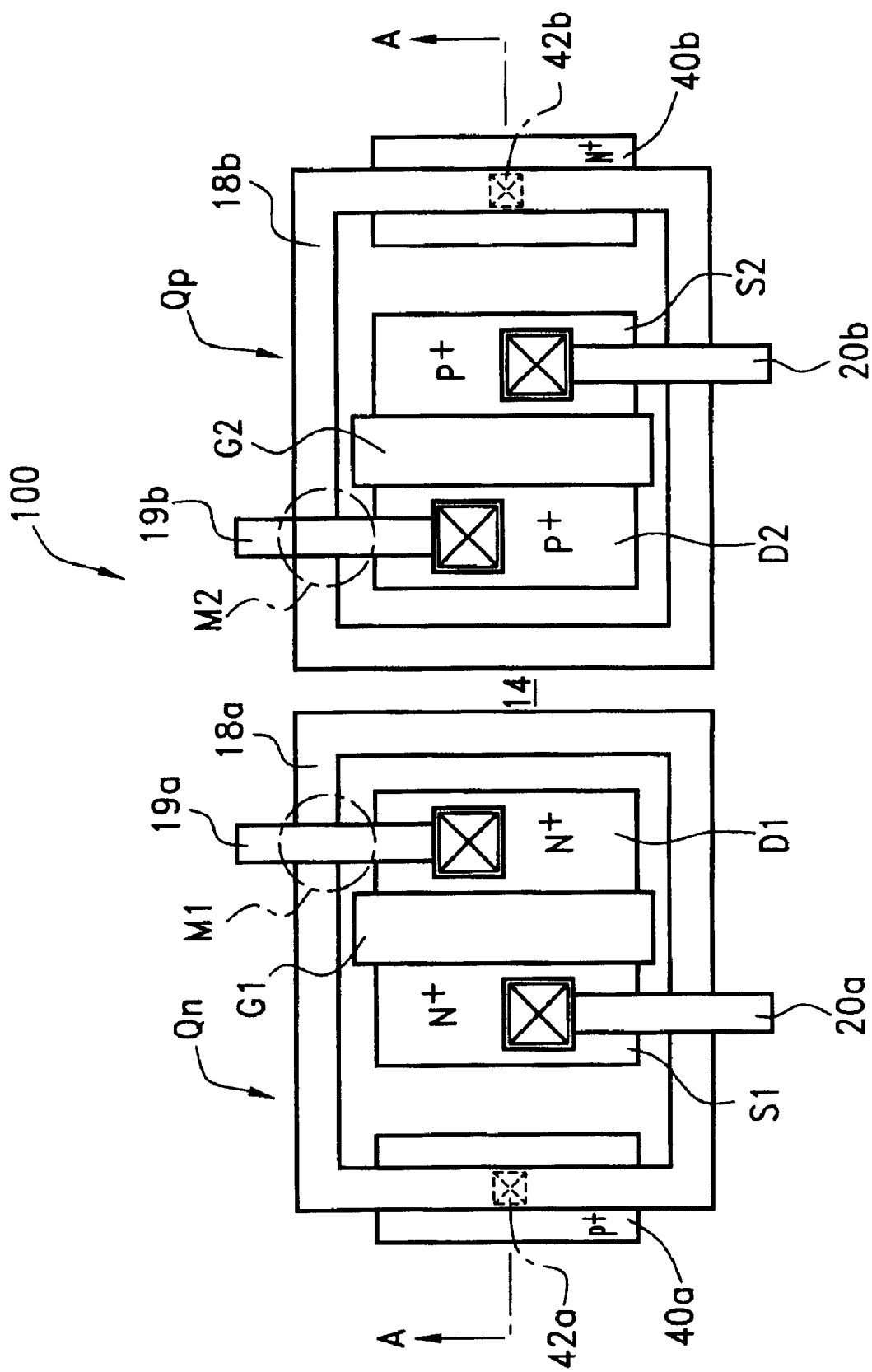
FIG. 1 schematically shows a plan view of a main portion of a semiconductor device in accordance with a first embodiment of the present invention.

Certain embodiments of the present invention relate to a semiconductor device having a transistor with low breakdown voltage and a transistor with high breakdown voltage mixed-mounted on a common substrate, which can sufficiently cope with the device miniaturization, and which can achieve a highly reliable element isolation in a region where the transistors with high breakdown voltage are disposed.

A semiconductor device in accordance with an embodiment of the present invention comprises a substrate including at least one transistor with high breakdown voltage provided and at least one transistor with low breakdown voltage that operate at different voltages. The semiconductor device includes a wiring layer that is fed with a high potential and is provided above the transistor with high breakdown voltage through an interlayer dielectric film, a element isolation dielectric region on the substrate, and at least a fixed potential wiring layer between the element isolation dielectric region and the wiring layer.

By the semiconductor device described above, the fixed potential wiring layer alleviates the influence of the high potential fed on the wiring layer that is formed above the fixed potential wiring layer. Moreover, the fixed potential wiring layer prevents the operation of a parasitic transistor in an element isolation region in a high breakdown voltage transistor region where the at least one transistor with high breakdown voltage is formed, with the result that the element isolation region has a greater element isolation property. In various embodiments a "substrate" may include a semiconductor substrate and a well formed in the semiconductor substrate, and may also include a bulk type semiconductor substrate as well as an SOI (Silicon On Insulator) type substrate.

Many modifications can be made to the present invention. Some of such modifications include the following embodiments:

(a) In accordance with certain embodiments of the present invention, the wiring layer may electrically connect to a drain region of the transistor with high breakdown voltage. The effects described above are enhanced in the drain wiring to which a high potential is applied.

(b) In accordance with certain embodiments of the present invention, the fixed potential wiring layer may electrically connect to an impurity diffusion region provided in the substrate, and the impurity diffusion region is isolated from a source region and a drain region of the transistor with high breakdown voltage by the element isolation dielectric region. A contact region formed in the semiconductor substrate or a guardring region for element isolation may be used as the impurity diffusion region. When the guardring region is used as a potential fixing section, an independent impurity diffusion region does not need to be provided as a contact region, and therefore device element area can be minimized. In this manner, the fixed potential wiring layer and the impurity diffusion region are connected to each other to fix a potential on the fixed potential wiring layer to the substrate potential.

(c) In accordance with certain embodiments of the present invention, the fixed potential wiring layer may be composed of a metal wiring layer that is formed over a first interlayer dielectric film, and the wiring layer may be composed of a metal wiring layer formed over a second interlayer dielectric film that is disposed over the first wiring layer or an interlayer dielectric film over the second interlayer dielectric film. These metal wiring layers can be formed by an ordinary wiring technique.

(d) In accordance with certain embodiments of the present invention, an element isolation dielectric region in a region where the transistor with high breakdown voltage is disposed and an element isolation dielectric region in a region where the transistor with low breakdown voltage is disposed may preferably be formed by the same process, and may have substantially the same thickness.

As described above, the fixed potential wiring layer can inhibit or prevent the operation of a parasitic transistor in the element isolation region at the transistor with high breakdown voltage. As a result, the element isolation dielectric region can be made thinner even in the high breakdown voltage transistor region, compared to the case where a fixed potential wiring layer is not provided. In consideration of the miniaturization of a low breakdown voltage transistor region and implementation of multiple layers in the low breakdown voltage transistor region, the sum of a thickness of the element isolation dielectric region and a thickness of an interlayer dielectric film provided between the element isolation dielectric region and the fixed potential wiring layer is in a range of 600 nm to 1500 nm.

(e) In accordance with certain embodiments of the present invention, the fixed potential wiring layer may be in the shape of a ring that surrounds the transistor with high breakdown voltage. In this case, the fixed potential wiring layer may be formed in a region that generally corresponds to the guardring region for element isolation. As a result, the fixed potential wiring layer and the guardring region can be readily connected to each other.

Also, the fixed potential wiring layer may have a plate shape that covers an area including a drain region and an element isolation dielectric region outside the drain region. In this case, the fixed potential wiring layer may further include a portion that generally corresponds to the guardring region for element isolation. As a result, the fixed potential wiring layer and the guardring region can be readily connected to each other. Furthermore, the fixed potential wiring layer having a plate-like shape may include a slit section. The slit section may act to alleviate mechanical stress in the fixed potential wiring layer. Furthermore, the fixed potential wiring layer having the plate-like shape may include an opening section for passing a contact section that connects the wiring layer and the drain region.

(f) The fixed potential wiring layer may in certain embodiments be set at a potential lower than the high potential to attain the above-described effects. More preferably, the fixed potential wiring layer may be fixed at a ground potential.

Other features and advantages of the invention will be apparent from the following description, taken in conjunction with the accompanying drawings that illustrate, by way of example, various features of certain embodiments of the invention.

Preferred embodiments of the present invention will be described with reference to the accompanying drawings.

Figure 2:
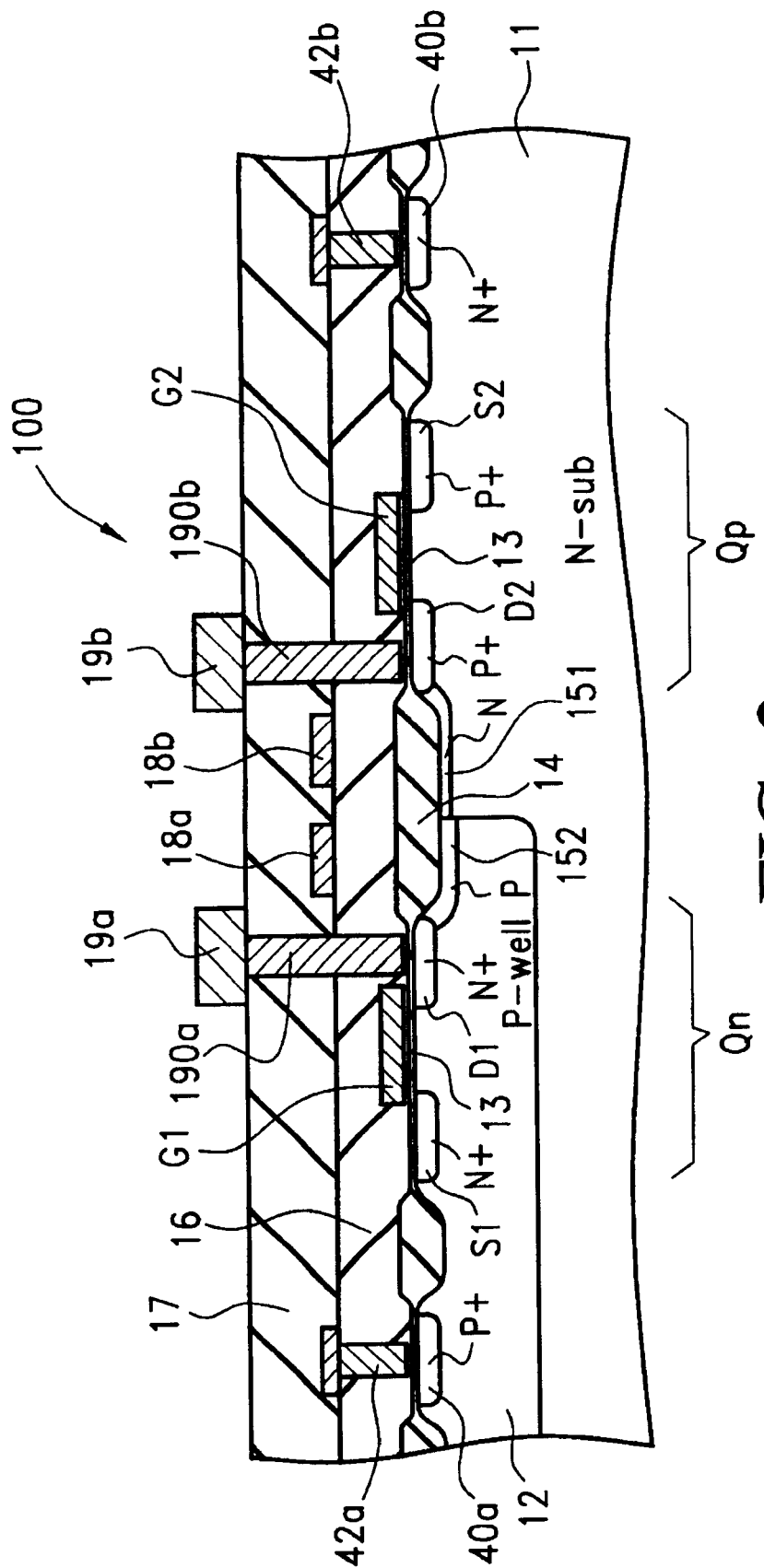
FIG. 2 shows a cross-sectional view taken along lines A—A of FIG. 1.

FIGS. 1 and 2 schematically show a semiconductor device 100 in accordance with a first embodiment of the present invention. FIG. 1 is a plan view of a region of the semiconductor device 100 where transistors with high dielectric strength and high breakdown voltage are disposed. FIG. 2 is a cross-sectional view taken along lines A—A of FIG. 1.

The semiconductor device 100 mix-mounts MOS transistors with high breakdown voltage and high dielectric strength Qn and Qp that may compose, for example, an input/output circuit, and MOS transistors with low voltage breakdown and low dielectric strength (not shown) that may compose, for example, a logic circuit.

FIG. 2 shows an N type semiconductor substrate 11 and a P type well 12 formed in the N type semiconductor substrate 11. An N channel MOS transistor with high breakdown voltage and high dielectric strength Qn is provided in the P type well 12. Also, a P channel MOS transistor with high breakdown voltage and high dielectric strength Qp, that is spaced a specified distance from the MOS transistor Qn, is formed in the N type semiconductor substrate 11. The MOS transistor Qn has a polysilicon gate G1 that is provided over the P type well 12 through a gate insulation film 13, and a source region S1 and a drain region D1 that are formed in the P type well 12 and separated from each other by the gate G1. The MOS transistor Qp has a polysilicon gate G2 that is provided over the N type semiconductor substrate 11 through a gate insulation film 13, and a source region S2 and a drain region D2 that are formed in the N type semiconductor substrate 11 and separated from each other by the gate G2.

An element isolation dielectric region 14 is formed over the semiconductor substrate 11 and the well 12 to electrically isolate the MOS transistors Qp and Qn from one another. An N type inversion prevention layer 151 and a P type inversion prevention layer 152 are formed in a semiconductor layer below the element isolation dielectric region 14 to prevent the operation of a parasitic MOS transistor.

A contact region 40a is formed in the P type well 12. The contact region 40a is composed of a P type impurity diffusion region and separated from the source region S1 and the drain region D1. The contact region 40a is electrically isolated from the source region S1 and the drain region D1 by the element isolation dielectric region 14. In a similar manner, a contact region 40b is formed in the N type semiconductor substrate 11. The contact region 40b is composed of an N type impurity diffusion region and separated from the source region S2 and the drain region D2. The contact region 40b is electrically isolated from the source region S2 and the drain region D2 by the element isolation dielectric film 14.

A first interlayer dielectric film 16 is disposed over the semiconductor substrate 11 and the P type well 12, and a second interlayer dielectric film 17 is disposed over the first interlayer dielectric film 16. A first metal wiring layer may be provided over the first interlayer dielectric film 16 and a second metal wiring layer may be provided over the second interlayer dielectric film 17.

The MOS transistors with high voltage breakdown and high dielectric strength Qn and Qp are connected to wirings, for example, metal wiring layers 19a and 19b that are connected to the drain regions D1 and D2. The metal wiring layers 19a and 19b are formed from the second metal wiring layer disposed over the second interlayer dielectric film 17. The metal wiring layers 19a and 19b may be formed from metal, such as, for example, aluminum, copper and the like, or an alloy containing the metal. The metal wiring layers 19a and 19b are connected to the drain regions D1 and D2 by contact sections 190a and 190b, respectively, that are embedded in contact holes formed in the first and second interlayer dielectric films 16 and 17.

The source regions S1 and S2 are connected to metal wiring layers 20a and 20b, respectively, as shown in FIG. 1. The metal wiring layers 20a and 20b may be formed from the second metal wiring layer disposed over the second interlayer dielectric film 17, in a similar manner as the metal wiring layers 19a and 19b are connected to the drain regions D1 and D2. Alternatively, the metal wiring layers 20a and 20b may be formed from the first metal wiring layer disposed over the first interlayer dielectric film 16.

Furthermore, a fixed potential wiring region or layer 18a and a fixed potential wiring region or layer 18b are provided over the first interlayer dielectric film 16 in a manner to s encircle the MOS transistor Qn and the MOS transistor Qp, respectively. The fixed potential wiring layers 18a and 18b are formed from the first metal wiring layer disposed over the first interlayer dielectric film 16. The fixed potential wiring layers 18a and 18b are provided at least between a metal wiring layer that is provided with a high potential and the element isolation dielectric region 14. For example, in one aspect of the present embodiment, as shown in FIG. 2, the fixed potential wiring layers 18a and 18b are provided between the element isolation dielectric region 14 and the metal wiring layers 19a and 19b that connect to the drain regions D1 and D2, respectively. In other words, as shown in FIG. 1, the fixed potential wiring layers 18a and 18b are formed in a manner to pass regions M1 and M2, respectively, where the element isolation dielectric region 14 opposes to the metal wiring layers 19a and 19b to which a high potential is fed. A parasitic MOS transistor with the element isolation dielectric film 14 functioning as a gate insulation film is formed in each of the regions M1 and M2.

In the present embodiment, each of the fixed potential wiring layer 18a and the fixed potential wiring layer 18b is in the shape of a ring that passes each of the regions M1 and M2, respectively. As seen in the embodiment illustrated in FIG. 1, the ring shape of the fixed potential wiring layer 18b is square when viewed from above. Embodiments may include a variety of shapes. The fixed potential wiring layer 18a and the fixed potential wiring layer 18b are connected to the contact regions 40a and 40b, respectively, that are composed of impurity diffusion regions, through contact sections 42a and 42b formed in the first interlayer dielectric film 16. Accordingly, the fixed potential wiring layer 18a over the N channel MOS transistor Qn is fixed at a potential of the P type well 12, and the fixed potential wiring layer 18b over the P channel MOS transistor Qp is fixed at a potential of the N type semiconductor substrate 11.

Certain embodiments of the semiconductor substrate having the structure described above may have at least one of the following effects and functions.

The fixed potential wiring layers 18a and 18b may function as shield layers that alleviate the influence on the semiconductor substrate 11, which is caused by the high potential (for example, 20–80 V) fed to the wiring layers 19a and 19b that are formed above the fixed potential wiring layers 18a and 18b. In other words, the fixed potential wiring layers 18a and 18b are fixed at a potential of the well 12 or a potential of the semiconductor substrate 11, and these potentials can be set at desired values within a guaranteed permissible dielectric strength or breakdown voltage range. For example, these potentials may be set to a ground potential. As a result, a potential distribution of the metal wiring layers 19a and 19b that are fed with a high potential may not exist under the fixed potential wiring layers 18a and 18b. Alternatively, if such a potential distribution exists, the potential distribution may be alleviated. As a result, a potential that is fed to a parasitic MOS transistor formed with the element isolation dielectric region 14 can be substantially lowered. Therefore, even when the thickness of the element isolation dielectric region 14 is about the same as the thickness of the element isolation dielectric film in the low breakdown voltage transistor region, the operation of a parasitic transistor can be inhibited or prevented.

As a consequence, the element isolation dielectric region can be made thinner even in the high breakdown voltage transistor region by the provision of the fixed potential wiring layers. As a result, the film thickness of the first interlayer dielectric film can be reduced, and the high breakdown voltage transistor region can well accommodate a higher density of the MOS transistors with low breakdown voltage in multiple layers. Also, the fixed potential wiring layers and the metal wiring layers to which a high potential is applied can be formed by an ordinary wiring process.

In the semiconductor device described above, the fixed potential wiring layer is formed in the shape of a ring having a rectangular shape. However, the fixed potential wiring layers are not restricted to this particular shape. In other words, in certain embodiments, the fixed potential wiring layer may be in any configuration as long as the fixed potential wiring layer is provided at least between an element isolation dielectric region and a metal wiring layer to which a high potential is applied, and can be connected to a contact region in the semiconductor substrate.

Figure 3:
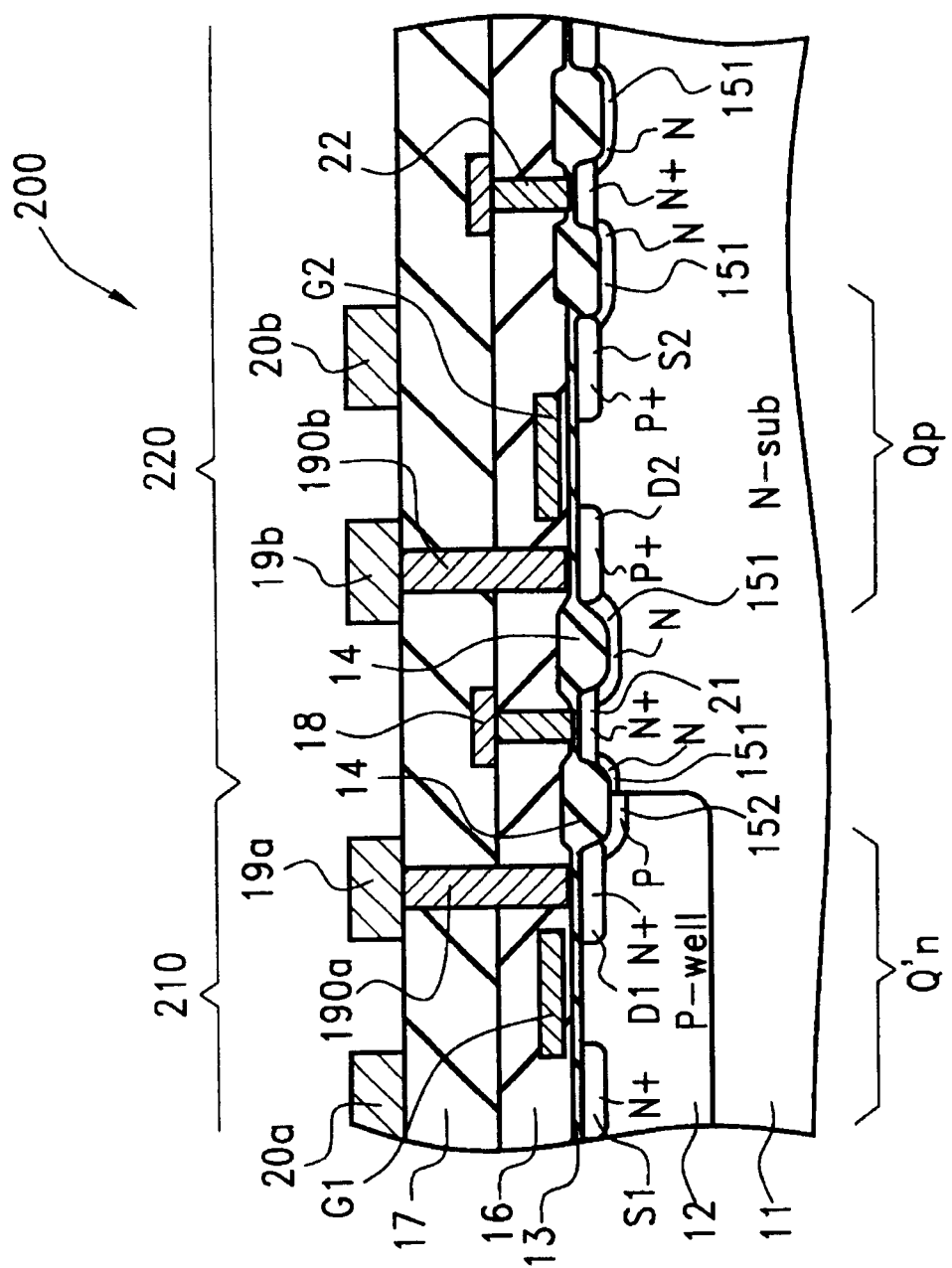
FIG. 3 schematically shows a plan view of a main portion of a semiconductor device in accordance with a second embodiment of the present invention.
Figure 4:
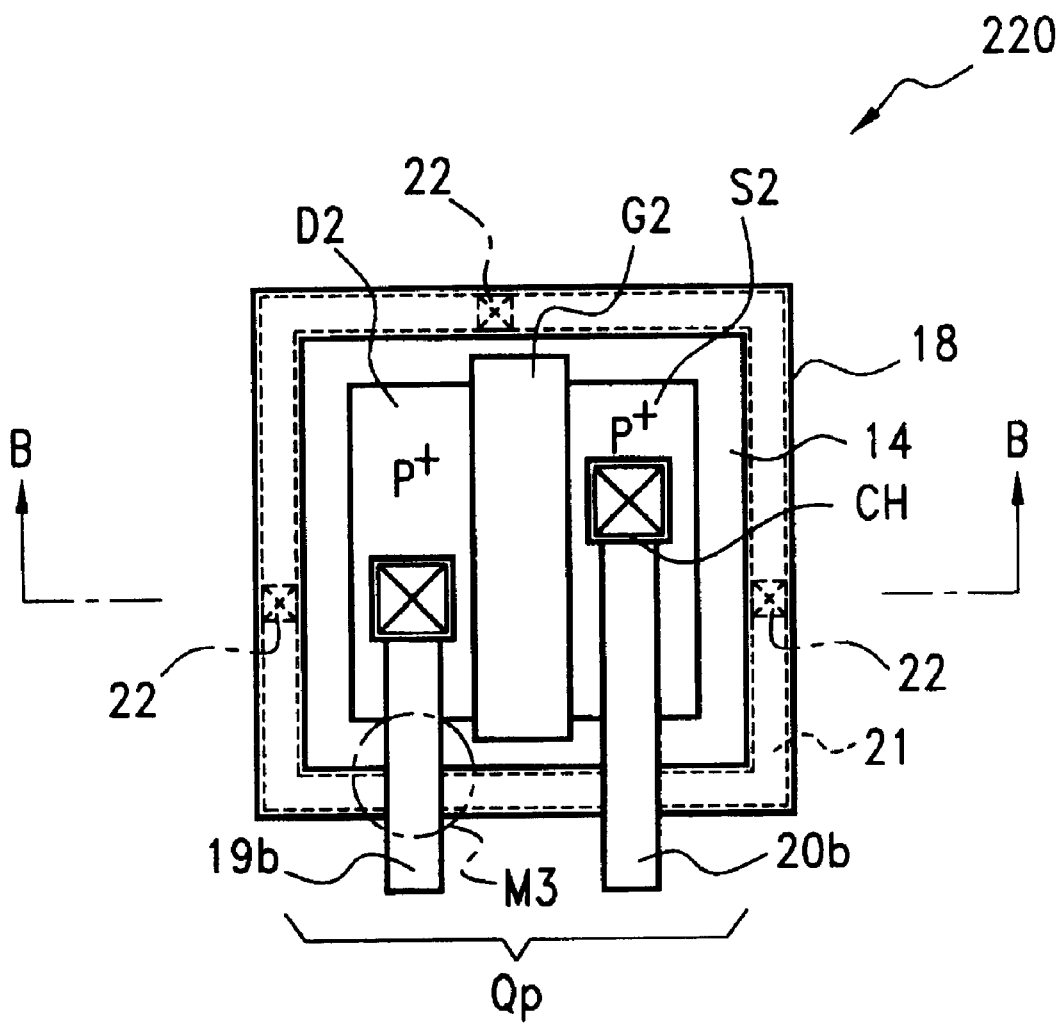
FIG. 4 shows a plan view of a region where one of the transistors with high breakdown voltage shown in FIG. 3 is formed.

FIGS. 3 and 4 schematically show a semiconductor device 200 in accordance with a second embodiment of the present invention. Elements in FIGS. 3 and 4 having the same operation as those shown in FIGS. 1 and 2 are indicated by the same reference numbers. FIG. 3 shows a cross section of a high breakdown voltage transistor region 220 and a low breakdown voltage transistor region 210. FIG. 4 is a plan view of the high breakdown voltage transistor region 220. FIG. 3 is a cross-sectional view taken along lines B—B of FIG. 4.

The semiconductor device 200 mix-mounts MOS transistors with high breakdown voltage that may compose, for example, an input/output circuit, and MOS transistors with low breakdown voltage that may compose, for example, a logic circuit.

FIG. 3 shows an N type semiconductor substrate 11 and a P type well 12 formed in the N type semiconductor substrate 11. An N channel MOS transistor with low breakdown voltage and low dielectric strength Q'n is provided in the P type well 12. Also, a P channel MOS transistor with high breakdown voltage and high dielectric strength Qp is formed in the semiconductor substrate 11. The MOS transistor Q'n has a polysilicon gate G1 that is provided over the P type well 12 through a gate insulation film 13, and a source region S1 and a drain region D1 that are formed in the P type well 12 and separated from each other by the gate G1. The MOS transistor Qp has a polysilicon gate G2 that is provided over the N type semiconductor substrate 11 through a gate insulation film 13, and a source region S2 and a drain region D2 that are formed in the N type semiconductor substrate 11 and separated from each other by the gate G2.

An element isolation dielectric region 14 is formed over the semiconductor substrate 11 and the well 12 to electrically isolate the MOS transistors Q'n and Qp from one another. An N type inversion prevention layer 151 and a P type inversion prevention layer 152 are formed in a semiconductor layer below the element isolation dielectric region 14 to prevent the operation of a parasitic MOS transistor.

A guardring region 21 that is composed of an N type impurity diffusion region is formed in the semiconductor substrate 11 in the high voltage breakdown transistor region 220. The guardring region 21 is separated from the source region S2 and the drain region D2. The guardring region 21 is electrically isolated from the source region S2 and the drain region D2 by the element isolation dielectric region 14. The guardring region 21 is formed by an impurity diffusion of high concentration with an opposite polarity of that of the impurity diffusion layer of the source region S2 and the drain region D2, such that its PN junction inhibits or prevents junction leaks of the devices.

A first interlayer dielectric film 16 is disposed over the semiconductor substrate 11 and the P type well 12, and a second interlayer dielectric film 17 is disposed over the first interlayer dielectric film 16. A first metal wiring layer may be provided over the first interlayer dielectric film 16 and a second metal wiring layer may be provided over the second interlayer dielectric film 17.

The MOS transistors Q'n and Qp are connected to wirings, for example, metal wiring layers 19a and 19b that are connected to the drain regions D1 and D2. The metal wiring layers 19a and 19b are formed from the second metal wiring layer disposed over the second interlayer dielectric film 17. The metal wiring layers 19a and 19b may be formed from metal, such as, for example, aluminum, copper and the like, or an alloy containing the metal. The metal wiring layers 19a and 19b are connected to the drain regions D1 and D2 by contact sections 190a and 190b, respectively, that are embedded in contact holes formed in the first and second interlayer dielectric films 16 and 17.

The source regions S1 and S2 are connected to metal wiring layers respectively. FIG. 4 shows only one of the metal wiring layers (i.e., 20b). The metal wiring layers may be formed from the second metal wiring layer disposed over the second interlayer dielectric film 17, in a similar manner as the metal wiring layers 19a and 19b are connected to the drain regions D1 and D2. Alternatively, the metal wiring layers may be formed from the first metal wiring layer disposed over the first interlayer dielectric film 16.

Furthermore, as shown in FIG. 4, a fixed potential wiring layer 18 is provided in the high voltage breakdown transistor region 220 over the first interlayer dielectric film 16 in a manner to encircle the MOS transistor Qp. FIG. 4 shows only one of the MOS transistors, i.e., the P type MOS transistor Qp. The fixed potential wiring layer 18 is formed from the first metal wiring layer over the first interlayer dielectric film 16.

The fixed potential wiring layer 18 is provided at least between a metal wiring layer that is fed with a high potential and the element isolation dielectric region 14. For example, in the present embodiment, the fixed potential wiring layer 18 is provided between the metal wiring layer 19b that is connected to the drain region D2 and the element isolation dielectric region 14. In other words, as shown in FIG. 4, the fixed potential wiring layer 18 is formed in a manner to pass through a region M3, where the element isolation dielectric region 14 opposes to the metal wiring layer 19b that is fed with a high potential. A parasitic MOS transistor with the element isolation dielectric region 14 functioning as a gate insulation film is formed in the region M3.

In the present embodiment, the fixed potential wiring layer 18 has a ring shape (square when viewed from above in FIG. 4) that passes through the region M3. The fixed potential wiring layer 18 is connected to the guardring region 21 that is composed of an impurity diffusion layer through a contact section 22 formed in the first interlayer dielectric film 16. Accordingly, in the high breakdown voltage transistor region 220, the fixed potential wiring layer 18 over the MOS transistor is fixed at a potential of the N type semiconductor substrate 11 or a potential of a P type well (not shown).

Certain embodiments of the semiconductor substrate having the structure described above may have at least one of the following effects and functions.

The fixed potential wiring layer 18 may function as a shield layer that alleviates the influence on the semiconductor substrate 11, which is caused by the high potential (for example, 20–80 V) applied to the wiring layer 19 that is formed above the fixed potential wiring layer 18. In other words, the fixed potential wiring layer 18 is fixed at a potential of the semiconductor substrate 11 or a potential of a well (not shown) in the high breakdown voltage transistor region 220, and these potentials can be set at desired values within a guaranteed permissible dielectric strength range. For example, these potentials may be set to a ground potential. As a result, a potential distribution of the metal wiring layer 19b that is fed with a high potential may not exist under the fixed potential wiring layer 18. Alternatively, if such a potential distribution exists, the potential distribution may be alleviated. As a result, a potential that is fed to a parasitic MOS transistor formed with the element isolation dielectric region 14 can be substantially lowered. Therefore, even when the thickness of the element isolation dielectric region 14 is about the same as the thickness of the element isolation dielectric region in the low breakdown voltage transistor region 210, the operation of a parasitic transistor can be inhibited or prevented.

As a consequence, the element isolation dielectric region can be made thinner even in the high breakdown voltage transistor region by the provision of the fixed potential wiring layer. As a result, the film thickness of the first interlayer dielectric film can be reduced, and the high breakdown voltage transistor region can well accommodate a higher density of the MOS transistors with low breakdown voltage in multiple layers. Also, the fixed potential wiring layers and the metal wiring layers that are fed with a high potential can be formed by an ordinary wiring process.

Furthermore, in the present embodiment, since the guardring 21 is commonly used as a potential fixing region for the fixed potential wiring layer 18, the device area is minimized.

In the semiconductor device described above, the fixed potential wiring layer may be formed in the shape of a ring extending in a rectangular manner. However, the fixed potential wiring layer is not restricted to this particular shape. In other words, in certain embodiments, the fixed potential wiring layer may be in any configuration as long as the fixed potential wiring layer is provided at least between an element isolation dielectric film and a metal wiring layer to which a high potential is applied, and can be connected to a guardring region in the semiconductor substrate.

Figure 5:
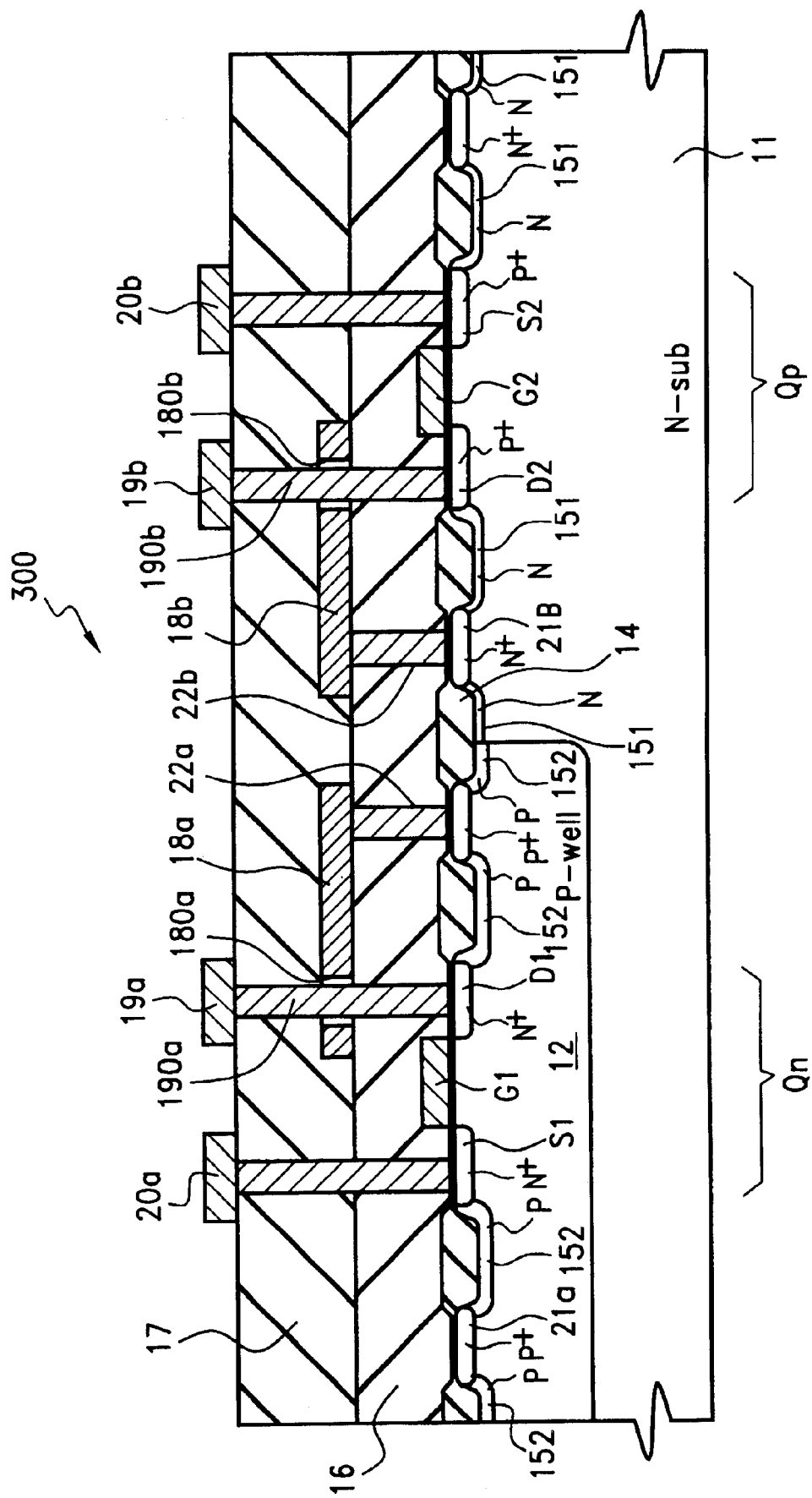
FIG. 5 schematically shows a plan view of a main portion of a semiconductor device in accordance with a third embodiment of the present invention.
Figure 6:
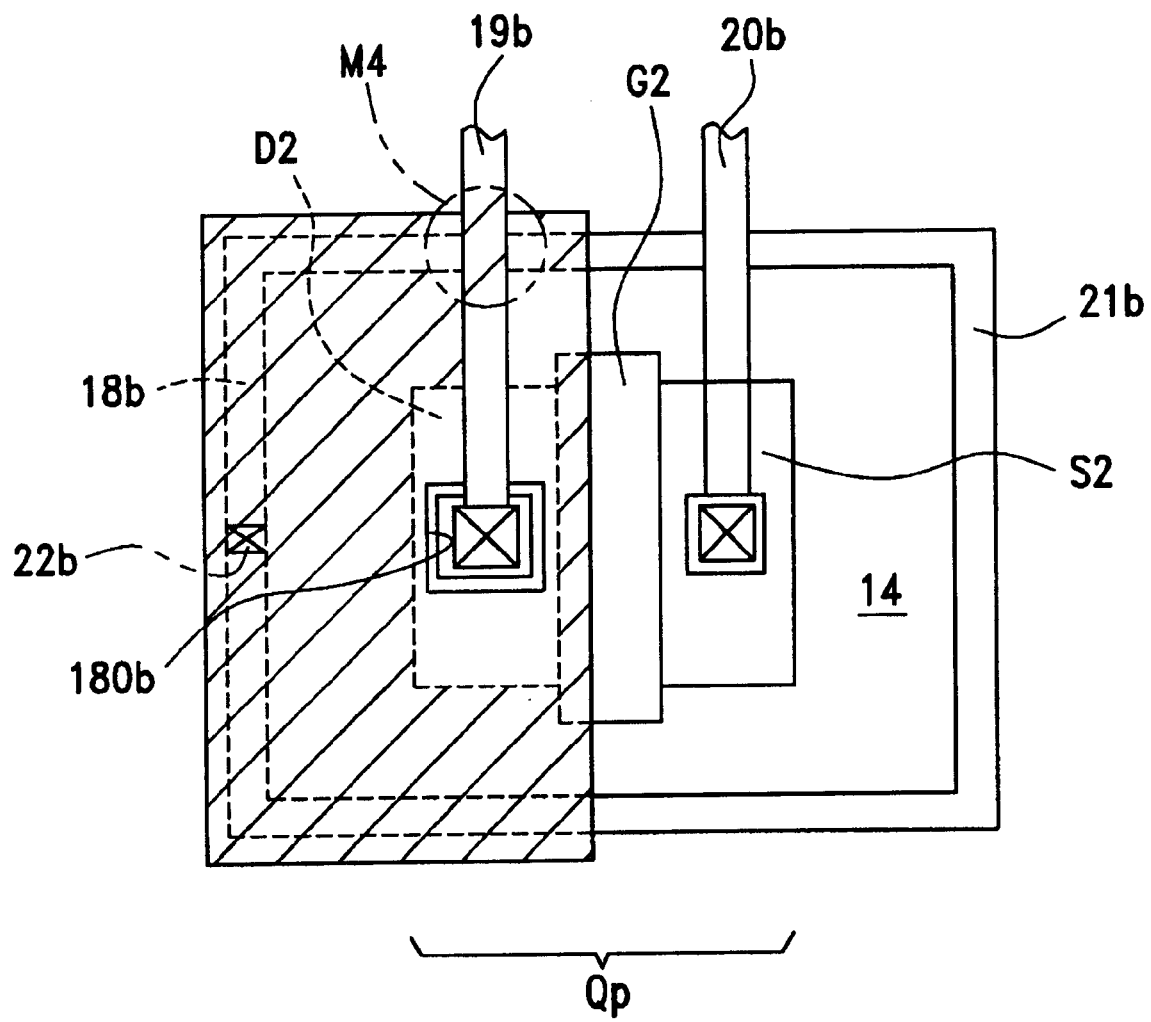
FIG. 6 shows a plan view of a region where one of the transistors with high breakdown voltage shown in FIG. 5 is formed.

FIGS. 5 and 6 schematically show a semiconductor device 300 in accordance with a third embodiment of the present invention. Elements in FIGS. 5 and 6 having the same operation as those shown in FIGS. 1 and 2 are indicated by the same reference numbers. FIG. 5 shows a cross section of a high breakdown voltage transistor region. FIG. 6 is a plan view of a region where one of the MOS transistors shown in FIG. 5 is formed.

The semiconductor device 300 mix-mounts MOS transistors with high breakdown voltage and high dielectric strength Qn and Qp that may compose, for example, an input/output circuit, and MOS transistors with low breakdown voltage and low dielectric strength (not shown) that may compose, for example, a logic circuit.

FIG. 5 shows an N type semiconductor substrate 11 and a P type well 12 formed in the N type semiconductor substrate 11. An N channel MOS transistor with high voltage breakdown and high dielectric strength Qn is provided in the P type well 12. Also, a P channel MOS transistor with high voltage breakdown and high dielectric strength Qp, that is spaced a specified distance from the MOS transistor Qn, is formed in the N type semiconductor substrate 11. The MOS transistor Qn has a polysilicon gate G1 that is provided over the P type well 12 through a gate insulation film 13, and a source region S1 and a drain region D1 that are formed in the P type well 12 and separated from each other by the gate G1. The MOS transistor Qp has a polysilicon gate G2 that is provided over the N type semiconductor substrate 11 through a gate insulation film 13, and a source region S2 and a drain region D2 that are formed in the N type semiconductor substrate 11 and separated from each other by the gate G2.

An element isolation dielectric region 14 is formed over the semiconductor substrate 11 and the well 12 to electrically isolate the MOS transistors Qp and Qn from one another. An N type inversion prevention layer 151 and a P type inversion prevention layer 152 are formed in a semiconductor layer below the element isolation dielectric region 14 to prevent the operation of a parasitic MOS transistor.

P type guardring region 21a and an N type guardring region 21b that are composed of impurity diffusion layers are formed in the well 12 and the semiconductor substrate 11, respectively.

As shown in FIG. 6, in a region where the P channel MOS transistor Qp is formed, the N type guardring region 21b is electrically isolated from the source region S2 and the drain region D2 by the element isolation dielectric region 14. Similarly, in a region where the N channel MOS transistor Qn is formed, the P type guardring region 21a is electrically isolated from the source region S1 and the drain region D1 by the element isolation dielectric region 14.

A first interlayer dielectric film 16 is disposed over the semiconductor substrate 11 and the P type well 12, and a second interlayer dielectric film 17 is disposed over the first interlayer dielectric film 16. A first metal wiring layer may be provided over the first interlayer dielectric film 16 and a second metal wiring layer may be provided over the second interlayer dielectric film 17.

The MOS transistors with high breakdown voltage and high dielectric strength Qn and Qp are connected to wirings, for example, metal wiring layers 19a and 19b that are connected to the drain regions D1 and D2. The metal wiring layers 19a and 19b are formed from the second metal wiring layer disposed over the second interlayer dielectric film 17. The metal wiring layers 19a and 19b may be formed from metal, such as, for example, aluminum, copper and the like, or an alloy containing the metal. The metal wiring layers 19a and 19b are connected to the drain regions D1 and D2 by contact sections 190a and 190b, respectively, that are embedded in contact holes formed in the first and second interlayer dielectric films 16 and 17.

The source regions S1 and S2 are connected to metal wiring layers 20a and 20b, respectively, as shown in FIG. 5. The metal wiring layers 20a and 20b may be formed from the second metal wiring layer disposed over the second interlayer dielectric film 17, in a similar manner as the metal wiring layers 19a and 19b are connected to the drain regions D1 and D2. Alternatively, the metal wiring layers 20a and 20b may be formed from the first metal wiring layer disposed over the first interlayer dielectric film 16.

Furthermore, a fixed potential wiring layer 18a and a fixed potential wiring layer 18b are provided over the first interlayer dielectric film 16 in a manner to oppose to at least parts of the MOS transistor Qn and the MOS transistor Qp, respectively. The fixed potential wiring layers 18a and 18b are formed from the first metal wiring layer disposed over the first interlayer dielectric film 16. The fixed potential wiring layers 18a and 18b are provided at least between metal wiring layers that are fed with a high potential and the element isolation dielectric region 14. For example, in the present embodiment, as shown in FIG. 5, the fixed potential wiring layers 18a and 18b are provided between the element isolation dielectric film 14 and the metal wiring layers 19a and 19b that are connected to the drain regions D1 and D2. In other words, as shown in FIG. 6, the fixed potential wiring layers 18a and 18b are formed in a manner to cover regions M4 (only one of the regions is shown), respectively, where the element isolation dielectric region 14 opposes to the metal wiring layers 19a and 19b that are fed with a high potential. A parasitic MOS transistor with the element isolation dielectric region 14 functioning as a gate insulation film is formed in each of the regions M4.

In the third embodiment, as shown in FIG. 6, the fixed potential wiring layer 18b has a plate shape that covers about one half of the device element region including the region M4. More particularly, the fixed potential wiring layer 18b covers an area including the drain region D2, the element isolation dielectric region 14 outside of the drain region D2, and the guardring region 21b. In a similar manner, the fixed potential wiring layer 18a has a plate-like shape that covers about one half of the device element region including the region M4. More particularly, the fixed potential wiring layer 18a covers an area including the drain region D1, the element isolation dielectric region 14 outside of the drain region D1, and the guardring region 21a. Also, the fixed potential wiring layers 18a and 18b include opening sections 180a and 180b for passing contact sections 190a and 190b, respectively.

The fixed potential wiring layer 18a and the fixed potential wiring layer 18b are connected to guardring regions 21a and 21b, respectively, that are composed of impurity diffusion layers, through contact sections 22a and 22b formed in the first interlayer dielectric film 16. Accordingly, the fixed potential wiring layer 18a over the N channel MOS transistor Qn is fixed at a potential of the P type well 12, and the fixed potential wiring layer 18b over the P channel MOS transistor Qp is fixed at a potential of the N type semiconductor substrate 11.

Certain embodiments of the semiconductor substrate having the structure described above may have at least one of the following effects and functions.

The fixed potential wiring layers 18a and 18b function as shield layers that alleviate the influence on the semiconductor substrate 1, which is caused by the high potential (for example, 20–80 V) fed to the wiring layers 19a and 19b that are formed above the fixed potential wiring layers 18a and 18b. In other words, the fixed potential wiring layers 18a and 18b are fixed at a potential of the well 12 or a potential of the semiconductor substrate 11, and these potentials can be set at desired values within a guaranteed permissible dielectric strength or breakdown voltage range. For example, these potentials may be set to a ground potential. As a result, a potential distribution of the metal wiring layers 19a and 19b that are fed with a high potential may not exist under the fixed potential wiring layers 18a and 18b. Alternatively, if such a potential distribution exists, the potential distribution may be alleviated. As a result, a potential that is given to a parasitic MOS transistor formed with the element isolation dielectric region 14 can be substantially lowered. Therefore, even when the thickness of the element isolation dielectric region 14 is about the same as the thickness of the element isolation dielectric film in the low breakdown voltage transistor region, the operation of a parasitic transistor can be inhibited or prevented.

As a consequence, the element isolation dielectric film can be made thinner even in the high breakdown voltage transistor region by the provision of the fixed potential wiring layers. As a result, the film thickness of the first interlayer dielectric film can be reduced, and the high breakdown voltage transistor region can well accommodate a higher density of the MOS transistors with low breakdown voltage in multiple layers. Also, the fixed potential wiring layers and the metal wiring layers that are fed with a high potential can be formed by an ordinary wiring process.

Figure 7:
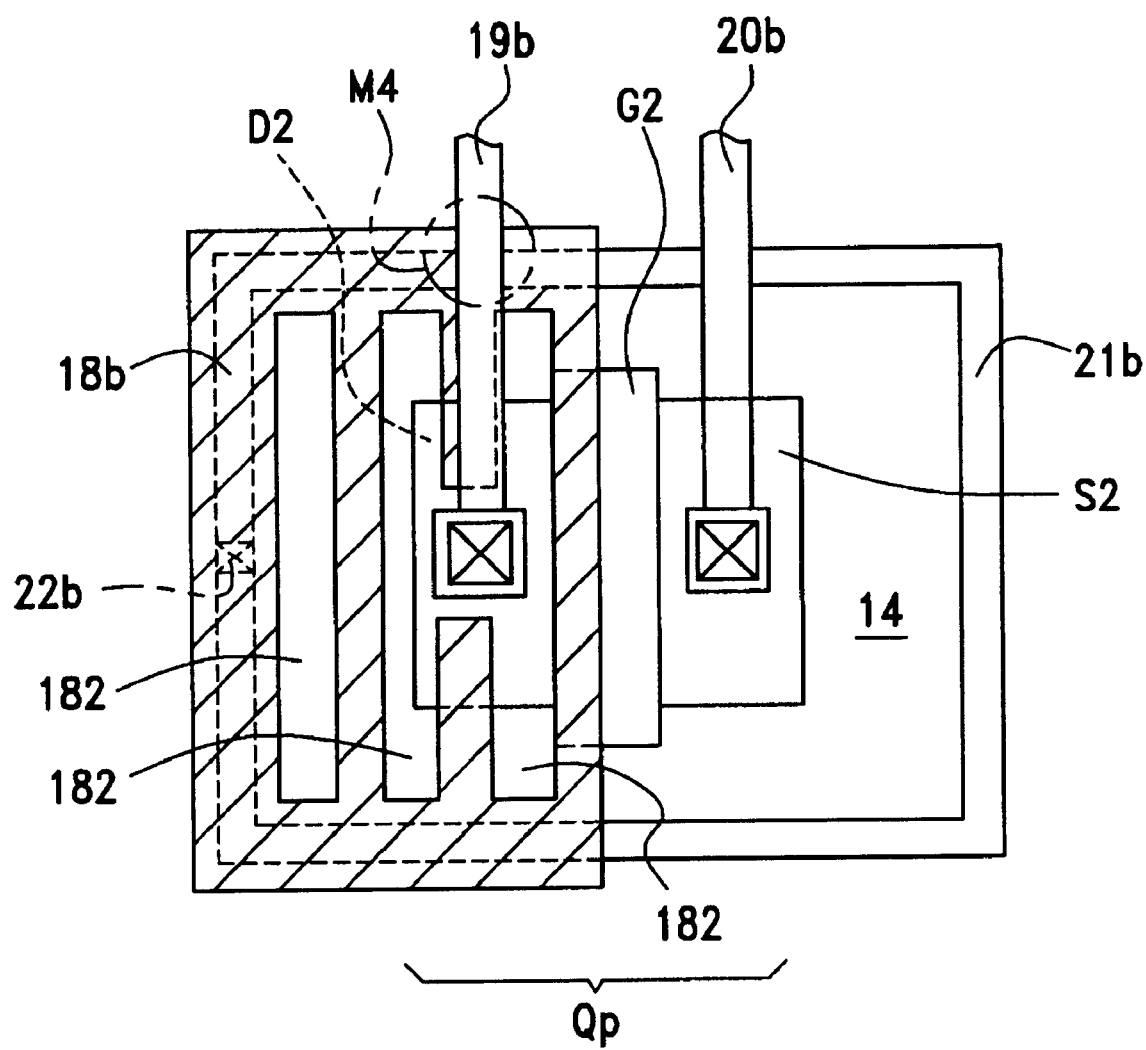
FIG. 7 shows a plan view of a modified example of the third embodiment of the present invention.

In certain embodiments of the semiconductor devices described above, the fixed potential wiring layer is formed in the shape of a ring. However, the fixed potential wiring layers are not restricted to this particular shape. For example, as shown in FIG. 7, the fixed potential wiring layer may, for example, have a plurality of slit sections 182, in addition to the structure shown in FIGS. 5 and 6. Elements shown in FIG. 7 that have substantially the same operation are indicated by the same reference numbers used in FIG. 6.

In addition to the effects obtained by the semiconductor device 300 described above, because of the provision of the slit sections 182, the fixed potential wiring layer 18b of this embodiment may better alleviate stresses that may be caused by metal layers, compared to a plain fixed potential wiring layer in a plate shape.

In the embodiments described above, the semiconductor device has a first interlayer dielectric film over the substrate and a second interlayer dielectric film over the first interlayer dielectric film. A fixed potential wiring layer is provided on the first interlayer dielectric film, and a wiring layer that is fed with a high potential is provided on the second interlayer dielectric film. However, the present invention is not limited to this particular structure. For example, the semiconductor device may include a layer of three or more interlayer dielectric films, i.e., a first interlayer dielectric film through an n-th interlayer dielectric film. A fixed potential wiring layer may be provided on the first interlayer dielectric film, and a wiring layer that is fed with a high potential is provided on the n-th interlayer dielectric film.

Preferred embodiments of the present invention are described above. However, semiconductor devices in accordance with the present invention are not limited to the embodiments described above, and may be provided with various modifications with the scope of the subject matter of the present invention. For example, conductive layers of the semiconductor substrate and the well may have polarities that are opposite to those described above. Also, the well is not limited to a particular configuration, and may, for example, have a triple-well structure. Furthermore, N type and P type inversion prevention layers may not have to be provided in a semiconductor layer below the element isolation dielectric film.

While the description above refers to particular embodiments of the present invention, it will be understood that many modifications may be made without departing from the spirit thereof. The accompanying claims are intended to cover modifications that fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device comprising:
    a substrate including a first breakdown voltage transistor area having at least one transistor with a first breakdown voltage and a second breakdown voltage transistor area having at least one transistor with a second breakdown voltage, wherein the first breakdown voltage is greater than the second breakdown voltage;
    an interlayer dielectric film provided over the substrate;
    a wiring layer provided over the interlayer dielectric film above the transistor with the first breakdown voltage;
    an element isolation region on the substrate; and
    at least one fixed potential wiring region in the first breakdown voltage transistor area between the element isolation dielectric region and the wiring layer.

2. A semiconductor device according to claim 1, wherein the wiring layer electrically connects to a drain region of the transistor with the first breakdown voltage.

3. A semiconductor device according to claim 1, wherein the fixed potential wiring layer electrically connects to an impurity diffusion region provided in the substrate, and the impurity diffusion region is isolated from a source region and a drain region of the transistor with a first breakdown voltage by the element isolation dielectric region.

4. A semiconductor device according to claim 1, wherein the interlayer dielectric film includes a first interlayer dielectric film over the substrate and a second interlayer dielectric film over the first interlayer dielectric film, and wherein the fixed potential wiring region comprises a metal wiring layer formed over the first interlayer dielectric film, and the wiring layer comprises a metal wiring layer formed over the second interlayer dielectric film.

5. A semiconductor device according to claim 1, wherein an element isolation dielectric region in the first breakdown voltage transistor area where the transistor with the first breakdown voltage is disposed and an element isolation dielectric region in the second breakdown voltage transistor area where the transistor with the second breakdown voltage is disposed have a substantially identical thickness.

6. A semiconductor device according to claim 1, wherein the fixed potential wiring region has a ring shape that surrounds the transistor with the first breakdown voltage.

7. A semiconductor device according to claim 1, wherein the fixed potential wiring region has a plate shape having an area that covers a drain region and an element isolation dielectric region outside the drain region.

8. A semiconductor device according to claim 1, wherein the fixed potential wiring region is set at a potential lower than the a potential fed to the wiring layer.

9. A semiconductor device according to claim 1, wherein wiring layer is adapted to feed a potential of 20–80 volts to the transistor with the first breakdown voltage.

10. A semiconductor device according to claim 1, wherein the fixed potential wiring region extends around the transistor with the first breakdown voltage when viewed from above.

11. A semiconductor device according to claim 1, wherein the fixed potential wiring region includes a plurality of slit sections.

12. A semiconductor device according to claim 3, wherein the impurity diffusion region is a guardring region for element isolation.

13. A semiconductor device according to claim 5, wherein the sum of a thickness of the element isolation dielectric region and a thickness of the interlayer dielectric film between the element isolation dielectric region and the fixed potential wiring region is in a range of 600 nm to 1500 nm.

14. A semiconductor device according to claim 6, wherein the impurity diffusion region is a guardring region for element isolation and the fixed potential wiring region is formed in a region that generally corresponds to the guardring region for element isolation.

15. A semiconductor device according to claim 7, wherein the impurity diffusion region is a guardring region for element isolation and the fixed potential wiring region further includes a portion that generally corresponds to the guardring region for element isolation.

16. A semiconductor device according to claim 7, wherein the fixed potential wiring region includes a slit section.

17. A semiconductor device according to claim 7, wherein the fixed potential wiring region has an opening section for passing a contact section that connects the wiring layer and the drain region.

18. A semiconductor device according to claim 15, wherein the impurity diffusion region is a guardring region for element isolation and the fixed potential wiring region further includes a portion that generally corresponds to the guardring region for element isolation.

19. A semiconductor device according to claim 8, wherein the fixed potential wiring region is set at a ground potential.

20. A semiconductor device comprising:
    a substrate comprising a first breakdown voltage transistor region including a first transistor and a second breakdown voltage transistor region including a second transistor having a breakdown voltage less than that that of the first transistor, wherein the first and second transistors operate at different voltages;
    an element isolation dielectric region formed on the substrate to electrically isolate the first transistor from the second transistor;
    a guardring region comprising an impurity diffusion region disposed in the semiconductor substrate in the first breakdown voltage transistor region;
    a first interlayer dielectric film disposed over the substrate;
    a second interlayer dielectric film disposed over the first interlayer dielectric film;
    a wiring layer including a first wiring portion that is connected to the first transistor and a second wiring portion that is connected to the second transistor;
    a fixed potential wiring region disposed in the first breakdown voltage transistor region between the element isolation dielectric region and the first wiring portion;
        wherein one of the wiring layer and the fixed potential wiring region is formed on the first interlayer dielectric film and the other of the wiring layer and the fixed potential wiring region is formed on the second interlayer dielectric film.

21. A semiconductor device according to claim 20, wherein the fixed potential wiring region is formed on the first interlayer dielectric film and the wiring layer is formed on the second interlayer dielectric film.

22. A semiconductor device according to claim 21, wherein the element isolation dielectric region has an equal thickness in the first breakdown voltage transistor region and the second breakdown voltage transistor region.

23. A semiconductor device according to claim 21, wherein the fixed potential wiring region extends around the first transistor when viewed from above.

24. A semiconductor device according to claim 21, wherein the fixed potential wiring region includes a plurality of slit sections.

* * * * *